United States Patent [19]
Nagayama

[11] Patent Number: 5,936,344
[45] Date of Patent: Aug. 10, 1999

[54] ORGANIC ELECTROLUMINESCENT ELEMENT

[75] Inventor: Kenichi Nagayama, Tsurugashima, Japan

[73] Assignee: Pioneer Electronic Corporation, Tokyo, Japan

[21] Appl. No.: 08/879,335

[22] Filed: Jun. 20, 1997

[30] Foreign Application Priority Data

Jun. 24, 1996 [JP] Japan ..................................... 8-182764

[51] Int. Cl.$^6$ .................................................. H05B 33/12

[52] U.S. Cl. ........................... 313/506; 313/504; 313/505

[58] Field of Search ...................................... 313/506, 500, 313/504, 505; 427/690; 315/169.3

[56] References Cited

U.S. PATENT DOCUMENTS

| | | | |
|---|---|---|---|
| 5,521,465 | 5/1996 | Budzilek et al. | 313/506 X |
| 5,712,528 | 1/1998 | Barroe et al. | 313/506 |
| 5,747,928 | 5/1998 | Shanks et al. | 313/506 X |

*Primary Examiner*—Ashok Patel
*Attorney, Agent, or Firm*—Perman & Green, LLP

[57] ABSTRACT

An organic electroluminescent element having a display quality is capable of being easily manufactured in a simple process in which the connecting-lines are layered as the metal-bus-lines with a low resistance. The element includes; a substrate carrying laminations each having an anode, organic emitting material layers made of organic compounds and a cathode. The cathode is layered on at least one of the organic emitting material layers. The substrate carrying a conductive connecting-line is electrically connected to the anode or the cathode, characterized by the connecting-line made of the same material as the cathode.

2 Claims, 4 Drawing Sheets

ORGANIC ELECTROLUMINESCENT ELEMENT

BACKGROUND OF THE INVENTION

1. Field of the Invention

The present invention relates to an organic electroluminescent element in a display device panel using an organic emitting material.

2. Description of the Related Art

There is a conventional display element comprising an organic electroluminescent element (also referred to herein as an organic EL element) utilizing organic emitting materials as shown in FIG. 4. The organic EL element is a current injection type element in which the emitting efficiency of the element depends on the resistance values of the electrode and the connecting-line. In this case, when the resistance values of the electrode and the connecting-line are high, a large voltage drop occurs due to the flowing electric current therein, so that it results in unevenness of luminosity to reduce the display quality of the panel.

Therefore, it is necessary that a material having a low resistance value is used for the electrode and the connecting-line formed on the substrate. There is a problem of the high sheet resistivity of the transparent electrode of electric conductive material such as indium-tin oxide (ITO) which is generally used for the anode.

To overcome such a problem of the ITO anode, a metal film with a low resistivity (also referred to herein as a metal-bus-line) is used for the connecting-line between the electrodes of the same kind to decrease the line resistance value. In this case, after the anodes and the organic emitting material layers of the organic compound are patterned in turn on the substrate, the cathodes are patterned on the organic emitting material layers, and then the metal-bus-lines are patterned so as to connect between the ITO anodes on the substrate.

However, such a two-patterning process of the cathode and the metal-bus-line is so complicated. Therefore, the manufacture cost of the resultant display panel is apt to be high.

SUMMARY OF THE INVENTION

The present invention is made in view of the forgoing problem. It is therefore an object of the invention is to provide an organic electroluminescent element capable of being easily manufactured in a simple process in which the connecting-lines are layered as the metal-bus-lines with a low resistance resulting in the organic EL element having a display quality.

The organic electroluminescent element in a first aspect of the invention comprises: a substrate carrying laminations each having an anode, organic emitting material layers made of organic compounds and a cathode, the cathode being layered on at least one of the organic emitting material layers, the substrate carrying a conductive connecting-line being electrically connected to the anode or the cathode, characterized by the connecting-line made of the same material as the cathode.

Furthermore, the organic electroluminescent element is characterized by the connecting-line being formed to have a thickness being substantially the same as that of the cathode in the first aspect of the invention mentioned above. The anode is made of indium-tin oxide and the conductive connecting-line is formed on said anode.

A method for manufacturing an organic electroluminescent element in a second aspect of the invention comprises the steps of:

forming laminations each having an anode, organic emitting material layers made of organic compounds which are layered in turn on a substrate; and layering a cathode on at least one of the organic emitting material layers and at the same time at least one of conductive connecting-lines on said substrate to be electrically connected to the anode or the cathode.

Furthermore, the method for manufacturing the organic electroluminescent element is characterized by the connecting-line being made of the same material as the cathode. The anode is made of indium-tin oxide.

These present inventions achieve the simultaneous formation both of the cathode and the metal-bus-line in a simple process and reduce unevenness of luminosity in the panel so that the organic EL element has a high display quality.

DETAILED DESCRIPTION OF PREFERRED EMBODIMENTS

Figure 1A:
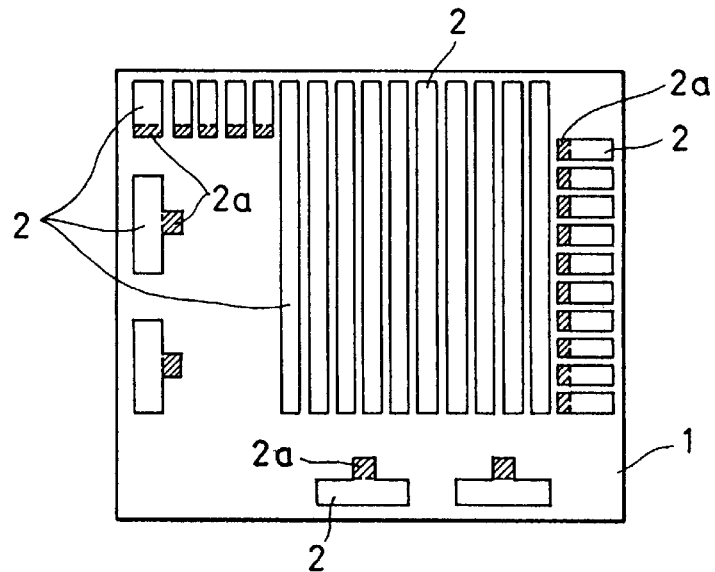
FIGS. 1A to 1C are plan views of the substrates respectively showing a process for forming an organic EL element in the first embodiment according to the present invention.
Figure 1B:
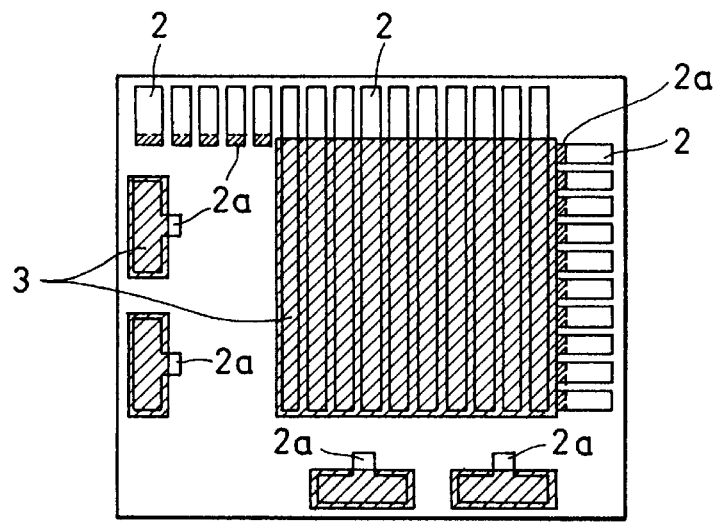
Figure 1C:
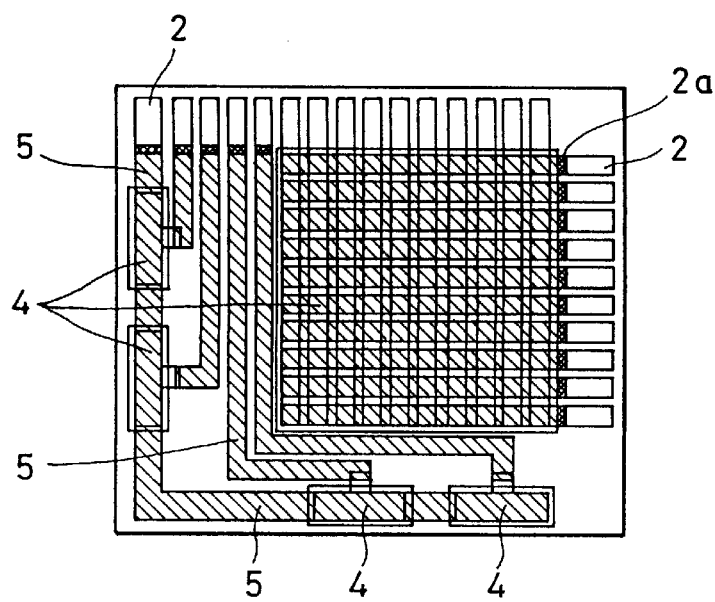

A first embodiment of the organic electroluminescent element according to the invention will be explained with reference to the accompanying drawings. FIGS. 1A to 1C are plan views of the substrates respectively showing a process for forming the organic EL element in the first embodiment according to the present invention.

First, first electrodes (anodes) 2 made of a light-permeable and conductive material such as ITO are patterned on a substrate 1 made of a light-permeable and insulative material such as glass (FIG. 1A).

In this case, contact portions 2a for connecting bus-lines as described later are simultaneously formed on the substrate.

Next, organic compound layers 3 of TPD and ALq$_3$ are patterned in turn in such a manner that the compound layers 3 cover the ITO first electrodes to be at least one region of the display patterns (FIG. 1B). In this case, the pattern shapes of the organic compound layers 3 avoid the contact portions 2a for the first electrode (the anode) as shown FIG. 1B.

Next, both second electrodes (cathodes) 4 and metal-bus-lines 5 are simultaneously formed (FIG. 1C) on the organic compound layers and the substrate. Namely, aluminum Al material is used for both of the second electrode (the cathode) 4 and the metal-bus-line 5. The Al second electrodes (the cathodes) 4 are formed on the organic compound layers disposed on the first electrodes (the anodes) 2 through the vapor deposition and, at the same time the metal-bus-lines 5 made of Al are vapor deposited on the substrate. In this way, the simultaneous formation both of the cathode for the emission display region and the metal-bus-line is achieved.

In addition, the portions of the metal-bus-lines 5 are vapor deposited on the corresponding contact portions 2 previously formed, so that the contact portions 2a and the metal-bus-lines 5 are simultaneously electrically connected to each other.

As mentioned above, the organic EL elements of the first embodiment according to the present invention are manufactured in which the display region has pixels 10×10 in matrix the anodes and cathodes perpendicular to each other.

Next, a second embodiment of the organic electroluminescent element according to the invention will be explained with reference to FIGS. 2A and 2B and 3A and 3B which are plan views of the substrates respectively showing a process for forming the organic EL element.

Figure 2A:
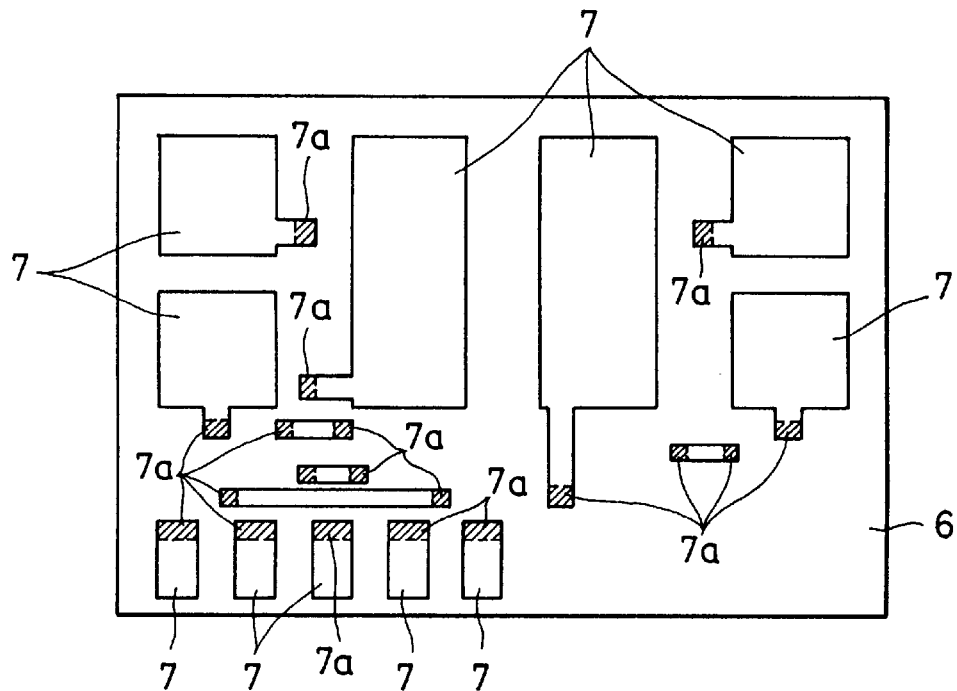
FIGS. 2A and 2B and 3A and 3B are plan views of the substrates respectively showing a process for forming an organic EL element in the second embodiment according to the present invention.

First, first electrodes (anodes) 2 made of a light-permeable and conductive material such as ITO are patterned on a substrate 1 made of a light-permeable and insulative material such as glass (FIG. 2A).

In this case, it is not always that the shapes of the first electrodes (the anodes) 7 are formed as the same pattern shown in FIG. 2A. The first electrodes have contact portions 7a for connecting bus-lines as described later, respectively.

Figure 2B:
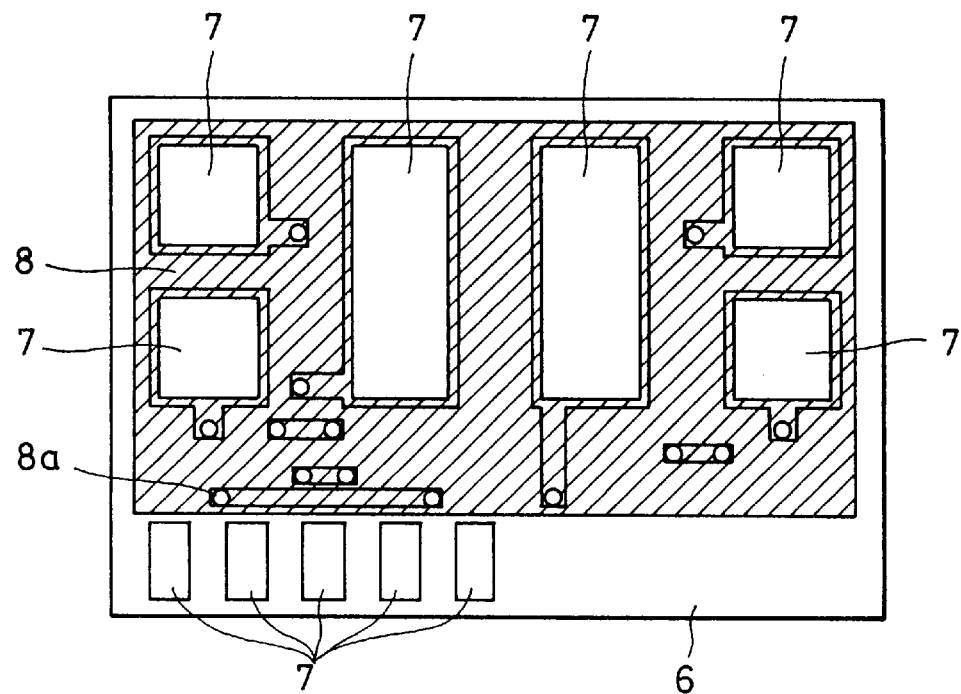

Next, an insulative layers 8 made of an insulative material such as $SiO_2$ or the like is formed on the substrate as shown in FIG. 2B. The shape of the insulative layer 8 covers the surface of the substrate 6 expect portions to be the emission display region and the openings 8a for contact holes i.e., through holes to connect the contact portions 7a of the first electrodes (the anodes) 7 to the bus-lines described later as shown in FIG. 2B.

Figure 3A:
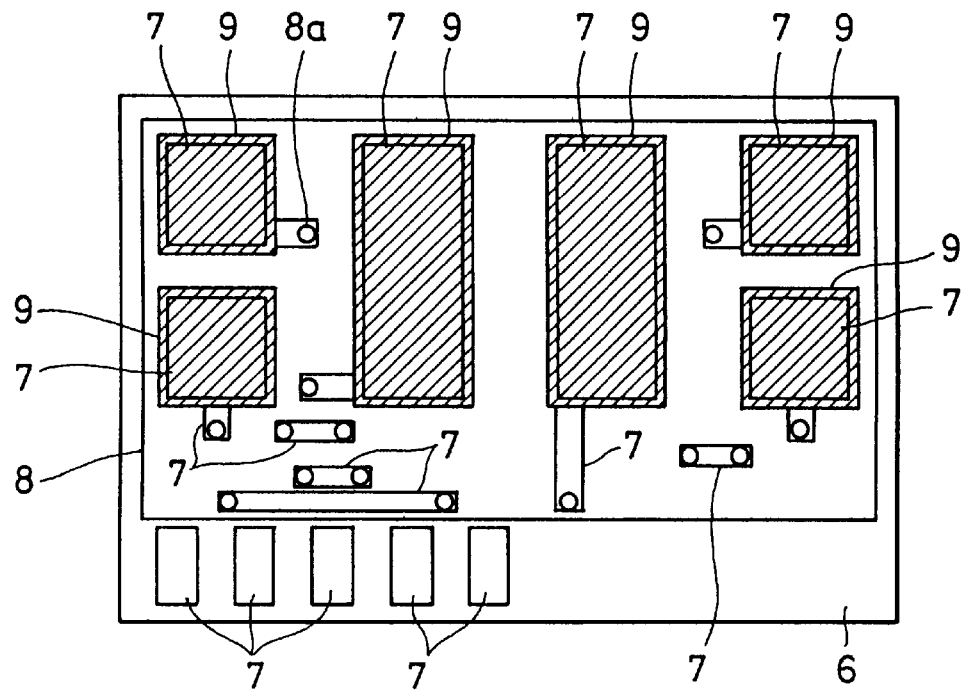
Figure 3B:
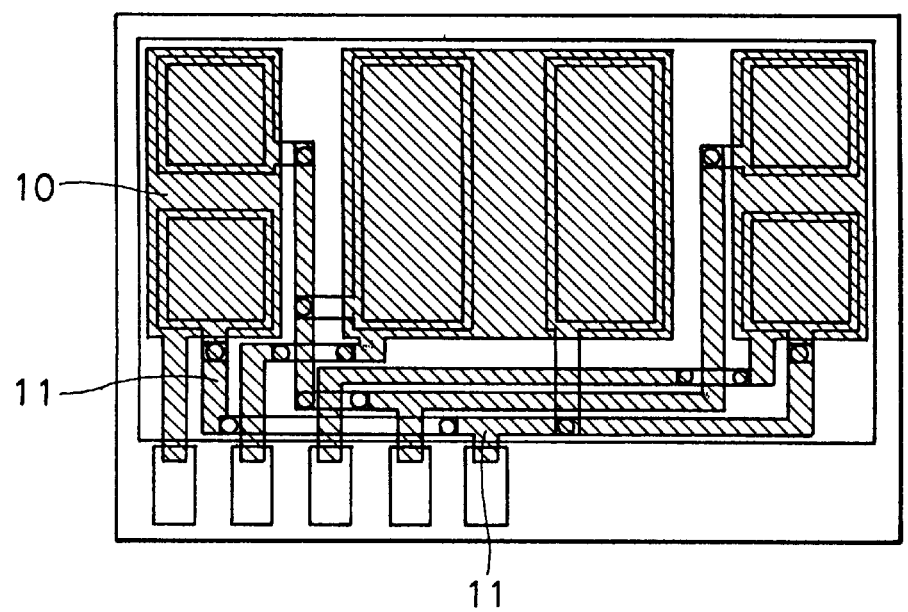
Figure 4:
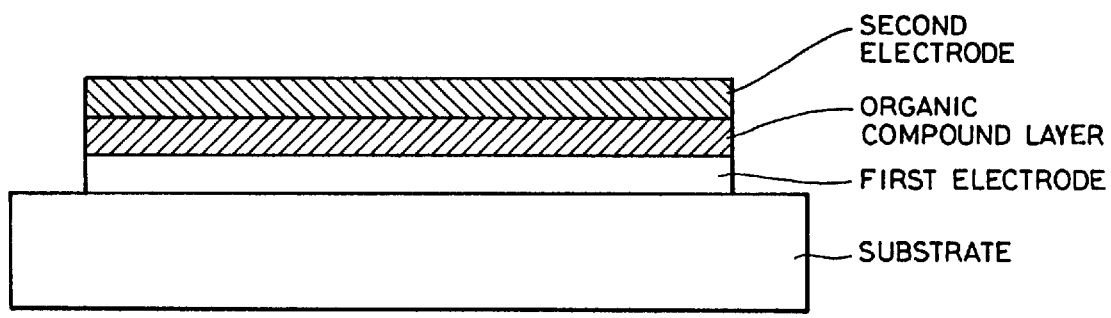
FIG. 4 is a cross-sectional view showing a conventional organic EL element.

Next, organic compound layers 9 of TPD and $ALq_3$ are formed in turn on the blank portions of the insulative layer 8 in such a manner that the compound layers 9 cover the first electrodes (the anodes) 7 to become regions of the emission display pattern in FIG. 3A. In this case, the pattern shapes of the organic compound layers 9 avoid the contact portions i.e., openings 8a.

Next, both second electrodes (cathodes) 10 and metal-bus-lines 11 are simultaneously formed (FIG. 3B) on the organic compound layers and the substrate. Namely, aluminum Al material is used for both of the second electrode (the cathode) 10 and the metal-bus-line 11. The Al second electrodes (the cathodes) 10 are formed on the organic compound layers 9 disposed on the first electrode (the anode) 7, so as to form display regions of the element, through the vapor deposition and, at the same time the metal-bus-lines 11 made of Al are vapor deposited on the substrate.

In addition, the portions of the metal-bus-lines 11 are vapor deposited on the corresponding contact portions 7a previously formed, so that the contact portions 7a and the metal-bus-lines 11 are simultaneously electrically connected to each other.

As mentioned above, the organic EL elements of the second embodiment according to the present invention is manufactured.

Since the organic electroluminescent elements of the present invention have the structures mentioned above, the simultaneous formation both of the cathode and the metal-bus-line is performed during the simple cathode making process. Therefore, the invention reduce achieves unevenness of luminosity in the panel of the organic EL element so that the panel has a high display quality.

What is claimed is:

1. An organic electroluminescent element comprising:

a substrate carrying laminations each having an anode, a plurality of organic material layers made of organic compounds and a cathode;

the cathode being layered on at least one of the organic material layers; and the substrate carrying a conductive connecting-line being electrically connected to the anode or the cathode, therein the connecting-line is made of the same material as the cathode and has a thickness substantially the same as that of the cathode.

2. An organic electroluminescent element according to claim 1 wherein said anode is made of indium-tin oxide said conductive connecting-line is formed on said anode.

* * * * *